US007474526B2

(12) United States Patent
Fujiwara

(10) Patent No.: US 7,474,526 B2
(45) Date of Patent: Jan. 6, 2009

(54) ELECTRONIC APPARATUS

(75) Inventor: Nobuto Fujiwara, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 11/787,056

(22) Filed: Apr. 13, 2007

(65) Prior Publication Data

US 2008/0037227 A1    Feb. 14, 2008

(30) Foreign Application Priority Data

May 19, 2006   (JP)   ............................. 2006-140315

(51) Int. Cl.
*H05K 7/20*   (2006.01)
*H01L 23/36*   (2006.01)
(52) U.S. Cl. .................... 361/687; 361/695; 361/700; 165/80.3; 165/104.21; 165/104.33; 165/122
(58) Field of Classification Search .............. 361/687, 361/690–697, 700–707, 709, 715, 719–721, 361/732, 831; 165/80.2, 80.3, 80.4, 80.5, 165/104.21, 104.26, 104.29, 104.33, 185; 62/259.2; 257/713–722; 174/15.2, 16.3, 174/252
See application file for complete search history.

(56) References Cited

U.S. PATENT DOCUMENTS 5,949,648 A * 9/1999 Liao ........................ 361/700

| 6,407,921 | B1* | 6/2002 | Nakamura et al. | ............ 361/700 |
| 6,442,025 | B2* | 8/2002 | Nakamura et al. | ............ 361/695 |
| 6,621,698 | B2* | 9/2003 | Chang | ........................ 361/687 |
| 6,650,540 | B2* | 11/2003 | Ishikawa | .................... 361/695 |
| 7,212,404 | B2* | 5/2007 | Wang et al. | ................. 361/697 |
| 7,325,590 | B2* | 2/2008 | Kim et al. | ............. 165/104.33 |
| 7,339,787 | B2* | 3/2008 | Cheng et al. | ................ 361/695 |
| 7,405,930 | B2* | 7/2008 | Hongo et al. | ............... 361/687 |
| 2006/0181857 | A1* | 8/2006 | Belady et al. | .............. 361/719 |

FOREIGN PATENT DOCUMENTS

| JP | 10-107469 | 4/1998 |
| JP | 2001-217366 | 8/2001 |
| JP | 2004-221604 | 8/2004 |

* cited by examiner

*Primary Examiner*—Michael V Datskovskiy
(74) *Attorney, Agent, or Firm*—Knobbe, Martens, Olson & Bear, LLP

(57) ABSTRACT

According to one embodiment, an electronic apparatus is provided with a circuit board contained in a case and including a first surface and a second surface formed on the reverse side of the first surface, a first heat generating component mounted on the first surface, a second heat generating component mounted on the second surface, a radiator section located off the circuit board, a first heat transfer member extending along the first surface and provided between the first heat generating component and the radiator section, and a second heat transfer member extending along the second surface and provided between the second heat generating component and the radiator section.

9 Claims, 9 Drawing Sheets

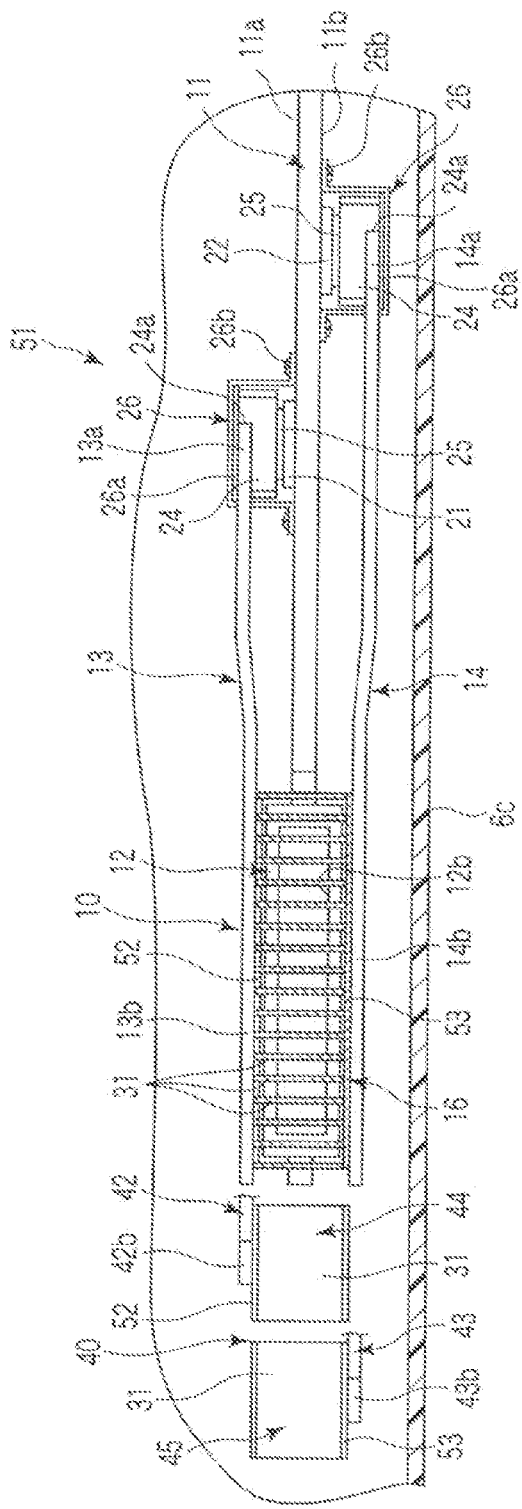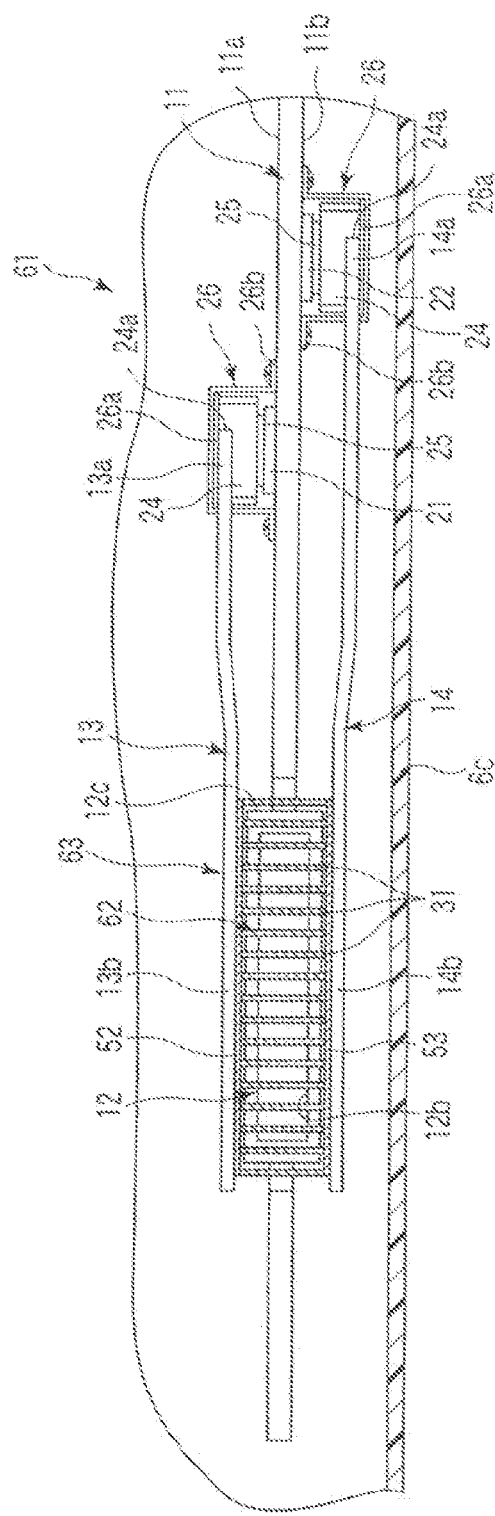

ELECTRONIC APPARATUS

CROSS-REFERENCE TO RELATED APPLICATIONS

This application is based upon and claims the benefit of priority from Japanese Patent Application No. 2006-140315, filed May 19, 2006, the entire contents of which are incorporated herein by reference.

BACKGROUND

1. Field

One embodiment of the invention relates to an electronic apparatus on which heat generating components are mounted, and to, for example, heat radiating structure of the heat generating components.

2. Description of the Related Art

An electronic apparatus, such as a portable computer, is mounted with heat generating components including a CPU. A remote heat exchanger (RHE) is an example of a structure for cooling these heat generating components. The RHE is basically composed of heat pipes, radiator fins, and a cooling fan. The radiator fins are located off a circuit board and, for example, near a peripheral wall of a case. The cooling fan cools the radiator fins. The heat pipes are provided between the heat generating components and the radiator fins and transfer heat from the heat generating components to the radiator fins.

An electronic apparatus having a cooling unit for cooling a plurality of heat generating components is disclosed in Jpn. Pat. Appln. KOKAI Publication No. 10-107469, for example. This electronic apparatus includes, for example, three heat generating components, three heat pipes, and a fin unit. The heat pipes are arranged between the fin unit and the heat generating components.

The power consumption of electronic components mounted in electronic apparatuses has become higher and higher in recent years. It is believed that any other heat generating components than CPUs, such as graphic chips, memories, etc., should preferably be directly cooled by means of an RHE in the future. In this case, one end of a heat transfer member, such as a heat pipe, may possibly be attached to each heat generating component, and the other end of the heat pipe to radiator members, such as radiator fins.

In attaching heat pipes to a plurality of heat generating components arranged side by side horizontally, for example, the heat pipes are also arranged adjacent to one another horizontally. In order to keep a necessary space for the lead-around of the adjacent heat pipes to radiator members, gaps of a predetermined or larger width must be provided between the heat generating components.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 9 is an exemplary sectional view of the portable computer taken along line F9-F9 of FIG. 8;

FIG. 11 is an exemplary sectional view of the portable computer taken along line F11-F11 of FIG. 10.

DETAILED DESCRIPTION

Various embodiments according to the invention will be described hereinafter with reference to the accompanying drawings. In general, according to one embodiment of the invention, An electronic apparatus is provided with a case; a circuit board contained in the case and including a first surface and a second surface formed on the reverse side of the first surface; a first heat generating component mounted on the first surface of the circuit board; a second heat generating component mounted on the second surface of the circuit board; a radiator section located off the circuit board; a first heat transfer member extending along the first surface of the circuit board and provided between the first heat generating component and the radiator section; and a second heat transfer member extending along the second surface of the circuit board and provided between the second heat generating component and the radiator section.

Embodiments of the present invention applied to portable computers will now be described with reference to the accompanying drawings.

Figure 1:
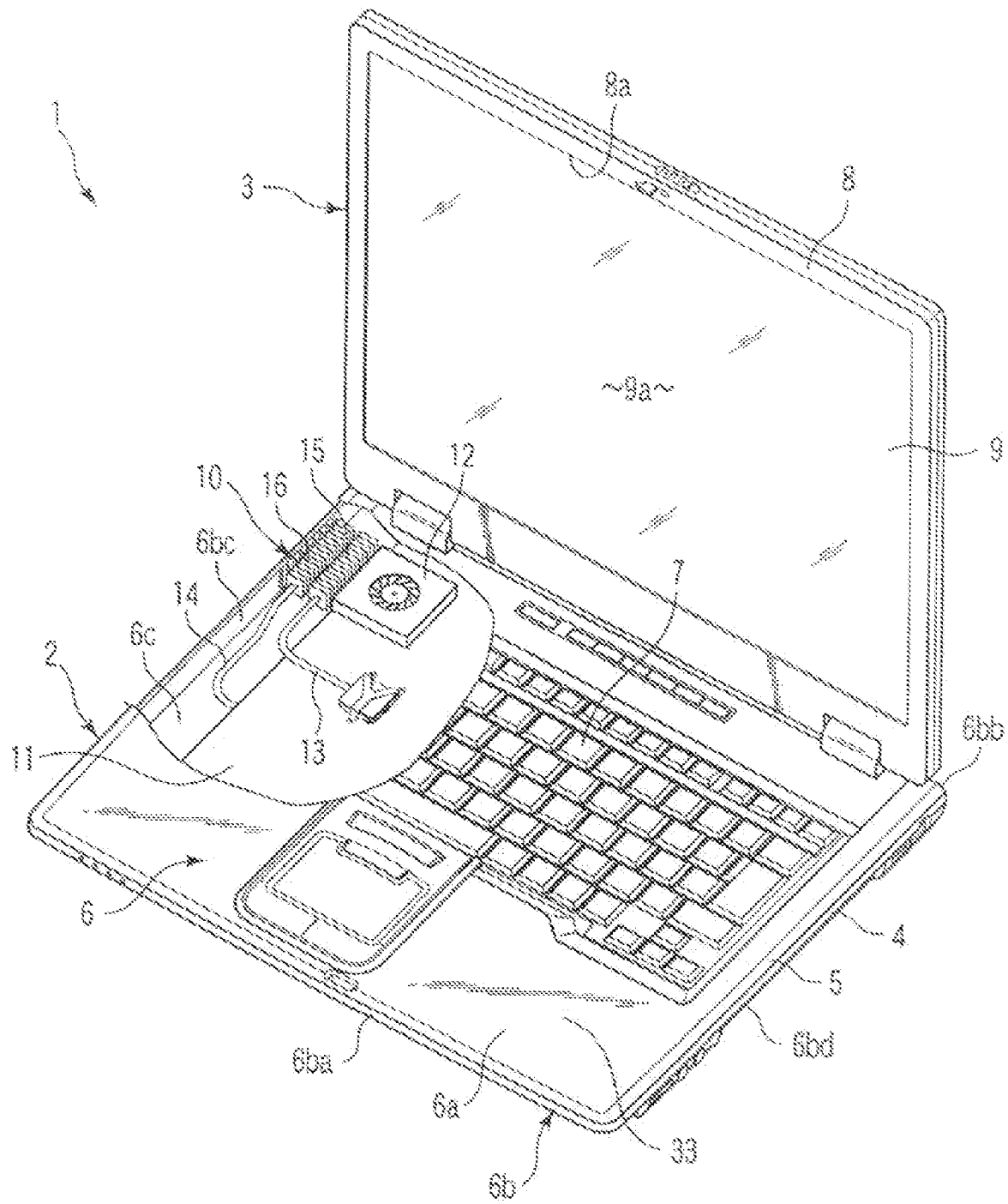
FIG. 1 is an exemplary perspective view of a portable computer according to a first embodiment of the invention.

FIGS. 1 to 6 show a portable computer 1 as an electronic apparatus according to a first embodiment of the invention. As shown in FIG. 1, the portable computer 1 includes a body 2 and a display unit 3.

The body 2 includes a body base 4 and a body cover 5. The cover 5 is combined with the base 4 from above. The body 2 is provided with a box-shaped case 6 formed of the base 4 and the cover 5 that are joined together. The case 6 has a top wall 6a, a peripheral wall 6b, and a bottom wall 6c. The top wall 6a supports a keyboard 7. The peripheral wall 6b has a front peripheral wall 6ba, a rear peripheral wall 6bb, a left-hand peripheral wall 6bc, and a right-hand peripheral wall 6bd.

The display unit 3 includes a display hosing 8 and a liquid crystal panel 9 contained in the hosing 8. The display panel 9 has a display screen 9a. The screen 9a is exposed to the outside of the display housing 8 through an opening 8a in the front face of the housing 8.

The display unit 3 is supported on the rear end portion of the case 6 by a hinge device. Thus, the display unit 3 is swingable between a closed position in which it is brought down to cover the top wall 6a from above and an open position in which it rises to allow the top wall 6a to be exposed.

Figure 2:
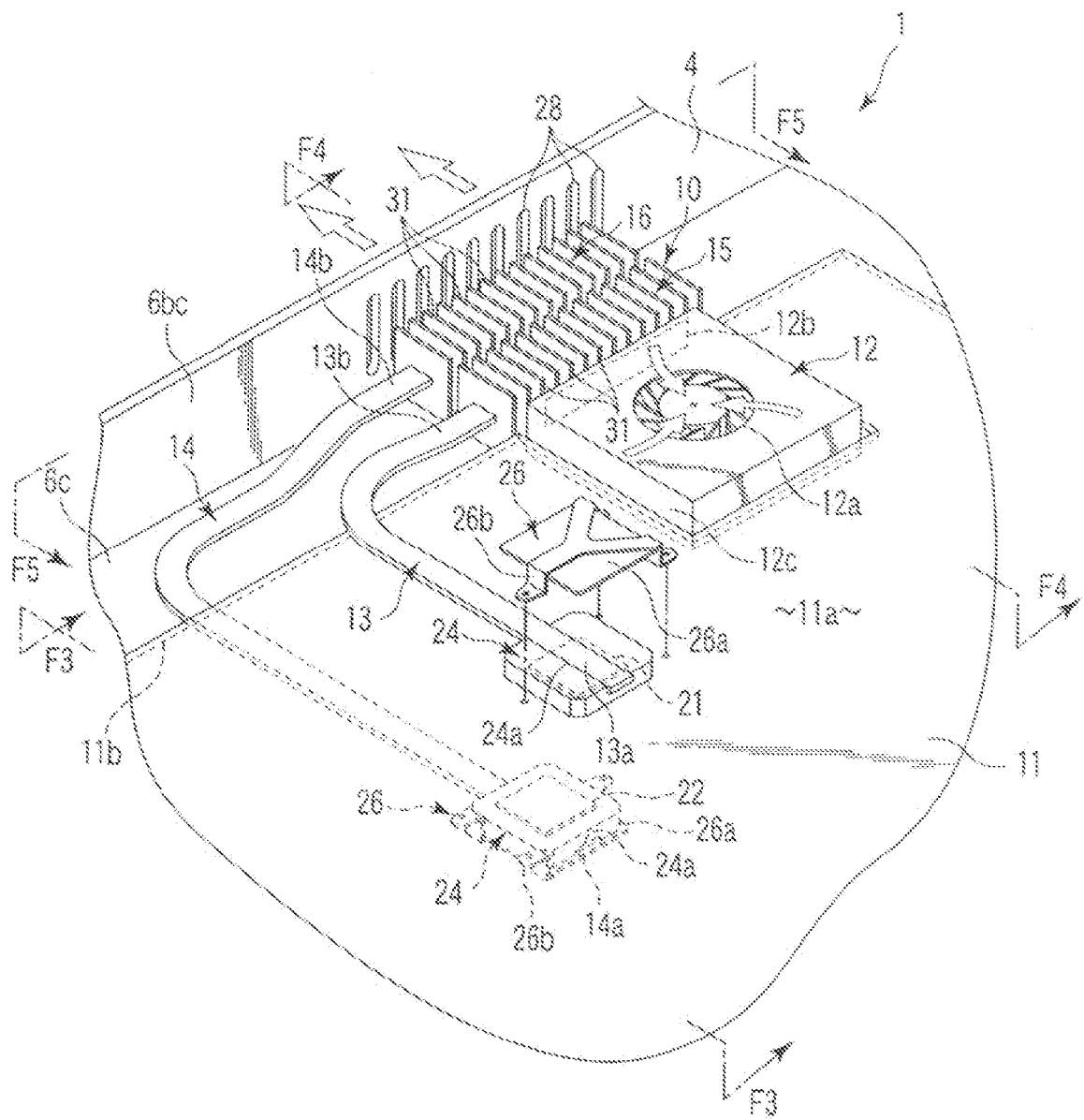
FIG. 2 is an exemplary perspective view showing the interior of a case of the portable computer according to the first embodiment.

As shown in FIG. 2, the case 6 contains a circuit board 11, a cooling fan 12, first and second heat pipes 13 and 14, and a radiator section 10. The radiator section 10 is located off the circuit board 11. The radiator section 10 has first and second radiator members 15 and 16.

The circuit board 11 has a first surface 11a and a second surface 11b. An example of the first surface 11a is the upper surface of the circuit board 11. The first surface 11a is the so-called obverse that faces the top wall 6a. An example of the second surface 11b is the lower surface of the circuit board 11, which is formed on the reverse side of the first surface 11a. The second surface 11b is the so-called reverse that faces the bottom wall 6c.

A first heat generating component 21, for example, is mounted on the first surface 11a of the circuit board 11. A second heat generating component 22, for example, is mounted on the second surface 11b of the circuit board 11. A plurality of other circuit components (not shown) is mounted on the circuit board 11. The heat generating components 21 and 22, among other circuit components mounted on the circuit board 11, are components that generate a particularly large quantity of heat, for example.

Examples of the heat generating components 21 and 22 include CPUs, graphics chips, various chip sets, memories, etc. However, heat generating components to which the embodiment of the invention is applicable are not limited to these examples. The heat generating components 21 and 22 may be any of various electronic components that require heat radiation. The first and second heat generating components 21 and 22, compared with the cooling fan 12, are located on the side of the front peripheral wall 6ba, that is, closer to the peripheral wall on the user side, for example.

Figure 3:
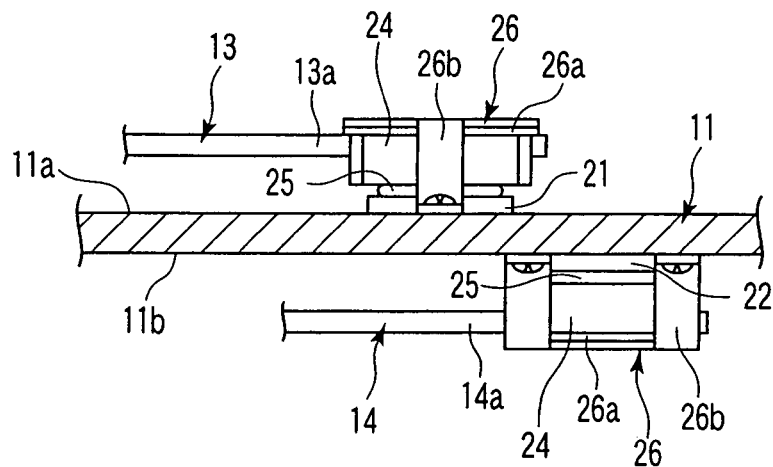
FIG. 3 is an exemplary sectional view of a circuit board taken along line F3-F3 of FIG. 2.

As shown in FIGS. 2 and 3, one end portion 13a of the first heat pipe 13 is attached to the first heat generating component 21. The first heat pipe 13 is an example of a first heat transfer member. One end portion 14a of the second heat pipe 14 is attached to the second heat generating component 22. The second heat pipe 14 is an example of a second heat transfer member. Each of the first and second heat pipes 13 and 14 is thermally connected to the first or second heat generating component 21 or 22 through a heat receiving block 24. More specifically, a groove 24a, for example, is cut in each heat receiving block 24 so as to extend along the direction of extension of the first or second heat pipe 13 or 14. The heat receiving block 24 is formed of, for example, a metal that has high thermal conductivity.

The respective one end portions 13a and 14a of the first and second heat pipes 13 and 14 are fitted individually in, for example, the respective grooves 24a of the heat receiving blocks 24. Specifically, the first and second heat pipes 13 and 14 are staked in the grooves 24a. Each heat receiving block 24 is placed on the first or second heat generating component 21 or 22 with a heat transfer member 25 between itself and the component 21 or 22. An example of the heat transfer member 25 is grease, a heat transfer sheet, or the like.

As shown in FIG. 2, each heat receiving block 24 is fixed to the circuit board 11 with a fixture 26. The fixture 26 has a cover portion 26a that supports the heat receiving block 24 and leg portions 26b that extend from the cover portion 26a toward the circuit board 11 and are screwed to the circuit board 11. The heat receiving blocks 24 and the heat pipes 13 and 14 are sandwiched between the circuit board 11 and the fixtures 26, whereby their respective positions are fixed. The method of mounting the heat pipes 13 and 14 is not limited to fitting but may be any other method, such as soldering.

Figure 4:
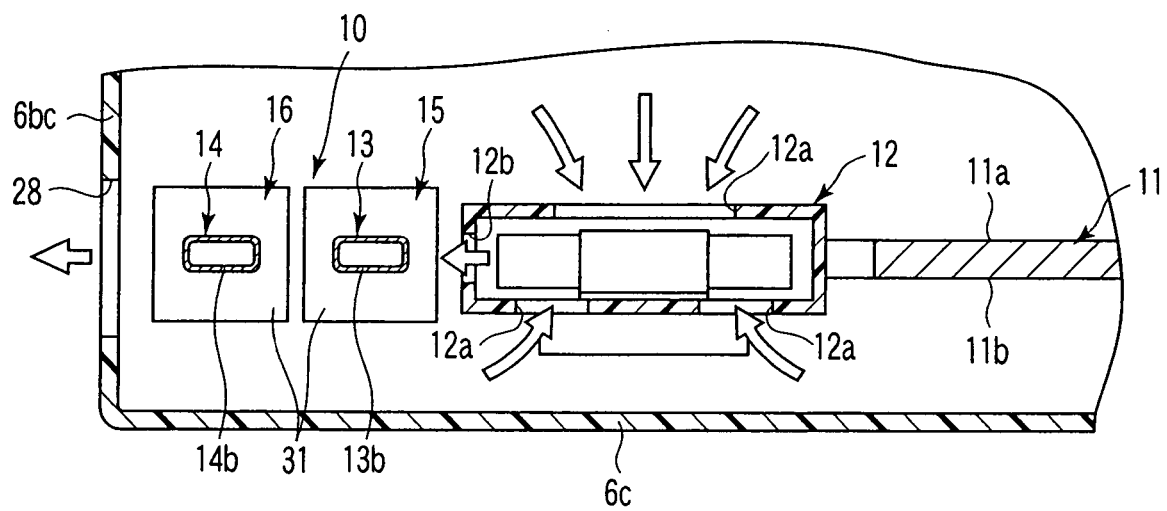
FIG. 4 is an exemplary sectional view of the portable computer taken along line F4-F4 of FIG. 2.

As shown in FIG. 2, the cooling fan 12 is located near the left-hand peripheral wall 6bc in the case 6. That part of the circuit board 11 which corresponds to the cooling fan 12 is cut out so as not to interfere with the fan 12. Specifically, as shown in FIG. 4, the cooling fan 12 is disposed in a position off the circuit board 11. The fan 12 is located side by side with the circuit board 11 along a direction (e.g., the horizontal in the present embodiment) parallel to the surfaces 11a and 11b of the board 11.

For example, a plurality of exhaust vents 28 is formed in the left-hand peripheral wall 6bc of the case 6 opposed to the cooling fan 12. The exhaust vents 28 open to the outside of the case 6. The cooling fan 12 has intake ports 12a through which air is drawn in and an exhaust port 12b through which drawn air is discharged. The intake ports 12a open in, for example, the upper and lower surfaces of the cooling fan 12, individually. The exhaust port 12b opens in a side face of the fan 12 and faces the exhaust vents 28 of the left-hand peripheral wall 6bc. The cooling fan 12 discharges air toward the exhaust vents 28.

The first and second radiator members 15 and 16 are located near the left-hand peripheral wall 6bc of the case 6 that is situated off the circuit board 11. More specifically, as shown in FIG. 2, both the first and second radiator members 15 and 16 are disposed between the exhaust port 12b of the cooling fan 12 and the exhaust vents 28 of the left-hand peripheral wall 6bc. The second radiator member 16 is located side by side with the first radiator member 15. Both the first and second radiator members 15 and 16 are opposed to the cooling fan 12. They extend parallel to each other along a direction across the direction of air discharge by the cooling fan 12. The radiator members 15 and 16 are arranged back and forth along flows of air. In the present embodiment, the first radiator member 15 is located, for example, between the second radiator member 16 and the cooling fan 12.

An example of each of the first and second radiator members 15 and 16 is formed by assembling a plurality of fin elements 31. Each fin element 31 is a plate-like member having, for example, a rectangular shape. Each fin element 31 is formed of a metal with high thermal conductivity, such as aluminum. The fin elements 31 are spaced apart from one another and have their respective planar surfaces extending along flows of air from the cooling fan 12.

The first heat pipe 13 extends along the first surface 11a of the circuit board 11 from the one end portion 13a attached to the first heat generating component 21 toward the left-hand peripheral wall 6bc of the case 6. As mentioned before, the first heat generating component 21 is situated nearer to the front peripheral wall 6ba of the case 6 than the cooling fan 12 is. The cooling fan 12 has a front side face 12c opposite the front peripheral wall 6ba of the case 6. The first heat pipe 13 extends along the front side face 12c of the fan 12.

Figure 5:
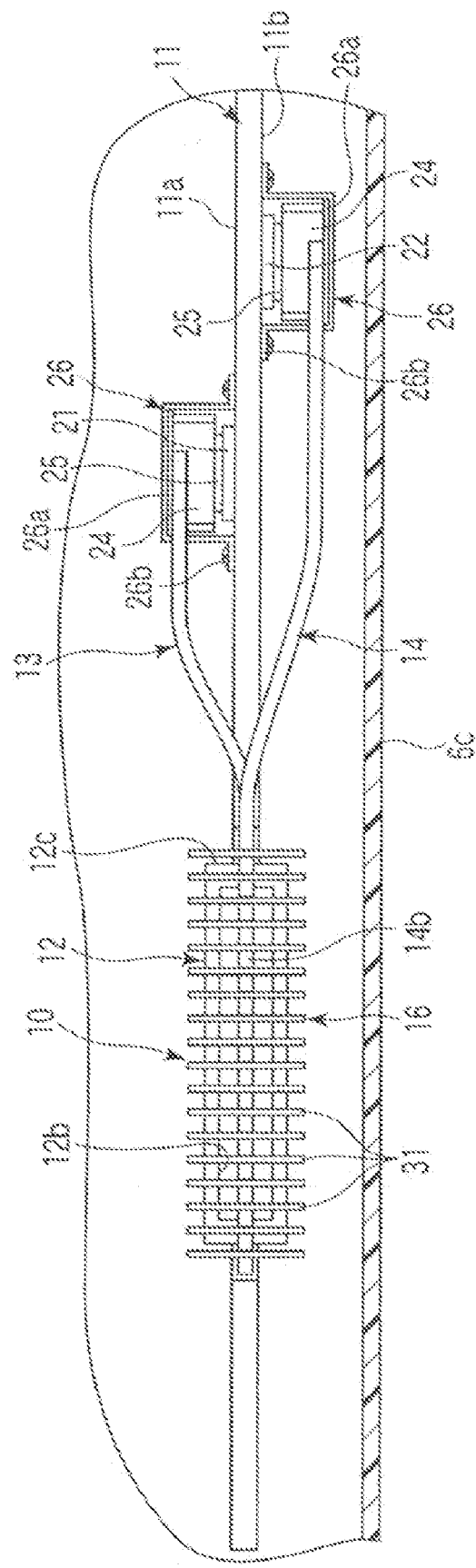
FIG. 5 is an exemplary sectional view of the portable computer taken along line F5-F5 of FIG. 2.
Figure 6:
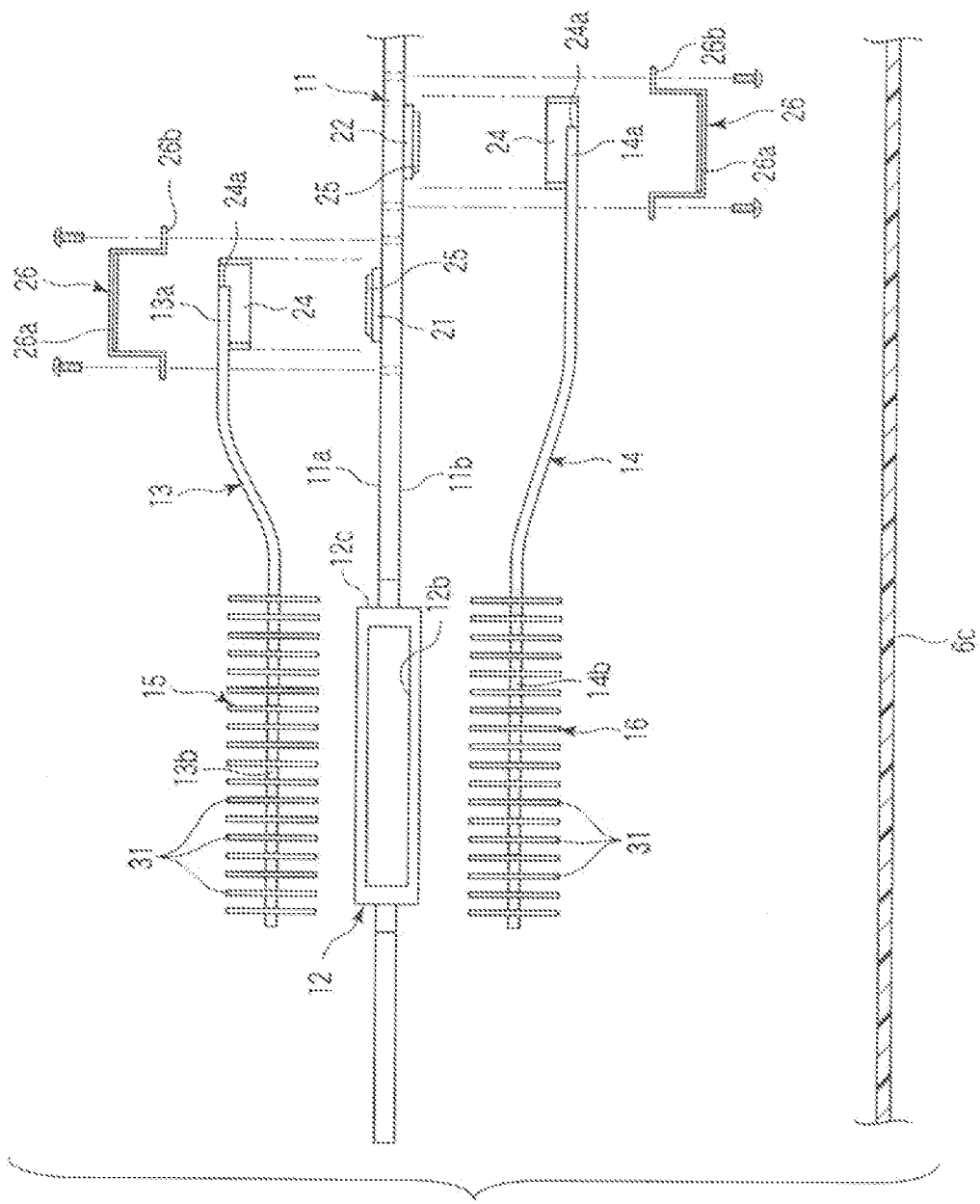
FIG. 6 is an exemplary exploded sectional view of the portable computer shown in FIG. 5.

The first heat pipe 13 that extends beyond the circuit board 11 is bent toward the first radiator member 15. As shown in FIGS. 5 and 6, the first heat pipe 13 bent in this manner is bent toward the center of the first radiator member 15 with respect to the vertical. Thus, the first heat pipe 13 is bent toward the bottom wall 6c of the case 6.

The distal end portion of the first heat pipe 13 extends along the exhaust port 12b of the cooling fan 12 and penetrates the fin elements 31. In other words, the first radiator member 15 is formed of the fin elements 31 that have a center hole each and are penetrated by the first heat pipe 13.

Specifically, the first heat pipe 13 is provided between the first heat generating component 21 and the first radiator member 15. The one end portion 13a of the first heat pipe 13 is thermally connected to the first heat generating component 21. The other end portion 13b of the first heat pipe 13 is thermally connected to the first radiator member 15. The first heat pipe 13 has a coolant fluid therein, which transfers heat between the opposite end portions 13a and 13b taking advantage of heat of vaporization and capillarity. The first heat pipe 13 transfers heat generated by the first heat generating component 21 to the first radiator member 15.

The second heat pipe 14 extends along the second surface 11b of the circuit board 11 from the one end portion 14a attached to the second heat generating component 22 toward the left-hand peripheral wall 6bc of the case 6. As mentioned before, the second heat generating component 22 is situated nearer to the front peripheral wall 6ba of the case 6 than the cooling fan 12 is. The second heat pipe 14 extends along the front side face 12c of the fan 12.

The second heat pipe 14 that extends beyond the circuit board 11 is bent toward the second radiator member 16. As shown in FIGS. 5 and 6, the second heat pipe 14 bent in this manner is bent toward the center of the second radiator member 16 with respect to the vertical. Thus, the second heat pipe 14 is bent toward the top wall 6a of the case 6. The distal end portion of the second heat pipe 14 extends along the exhaust port 12b of the cooling fan 12 and penetrates the fin elements 31. The second radiator member 16 is formed of the fin elements 31 that are penetrated by the second heat pipe 14.

The second heat pipe 14 is provided between the second heat generating component 22 and the second radiator member 16. The one end portion 14a of the second heat pipe 14 is thermally connected to the second heat generating component 22. The other end portion 14b of the second heat pipe 14 is thermally connected to the second radiator member 16. The second heat pipe 14 transfers heat generated by the second heat generating component 22 to the second radiator member 16.

In order to increase the area of installation on the heat receiving blocks 24, for example, the first and second heat pipes 13 and 14, having a diameter of, e.g., 6 mm, are flattened to a vertical thickness of about 3 mm when they are worked.

The first and second heat pipes 13 and 14 extend along the same side face 12c of the cooling fan 12. When viewed from above the case 6, for example, the heat pipes 13 and 14 extend substantially along the same track.

The following is a description of the operation of the portable computer 1.

When the portable computer 1 is worked, the first and second heat generating components 21 and 22 generate heat. Part of the heat generated by the first heat generating component 21 is transferred to the first radiator member 15 by the first heat pipe 13. Part of the heat generated by the second heat generating component 22 is transferred to the second radiator member 16 by the second heat pipe 14.

When the cooling fan 12 is actuated, air is discharged through the exhaust port 12b, whereupon the first and second radiator members 15 and 16 are cooled. The heat transferred from the heat generating components 21 and 22 to the first and second radiator members 15 and 16 is transferred to air discharged from the cooling fan 12, and the heated air is discharged to the outside of the case 6 through the exhaust vents 28. Thus, cooling of the first and second heat generating components 21 and 22 is accelerated.

According to the portable computer 1 constructed in this manner, the plurality of heat generating components 21 and 22 can be cooled and mounted with high density. Specifically, the heat pipes 13 and 14 are attached, respectively, to the heat generating components 21 and 22 that are mounted separately on the obverse and reverse of the circuit board 11, and the radiator members 15 and 16 to which the heat pipes 13 and 14 are connected are gathered in one place and cooled by, for example, the one cooling fan 12. Thus, cooling of the plurality of heat generating components 21 and 22 can be accelerated.

By mounting the plurality of heat generating components 21 and 22 separately on the obverse and reverse of the circuit board 11, the first and second heat pipes 13 and 14 can be prevented from adjoining each other along one surface of the circuit board 11. Specifically, the necessity of providing a space for the lead-around of the heat pipes can be reduced, so that the first and second heat generating components 21 and 22 can be located close to each other on the obverse and reverse sides. Thus, the heat generating components 21 and 22 can be mounted with high density.

If the heat generating components 21 and 22 can be located close to each other, it is possible to reduce regions in the circuit board 11 where temperature increases, so that a layout configuration with high cooling efficiency can be achieved. For example, the first and second heat generating components 21 and 22 can be intensively mounted in a region under the keyboard 7 that is not accessible to a user, avoiding a space under a palm rest or the like that can be touched by the user.

If the first and second heat pipes 13 and 14 are prevented from adjoining each other along the one surface of the circuit board 11, the degree of freedom of the lead-around of the heat pipes increases. This helps the lead-around of the heat pipes 13 and 14 in the case 6 that is limited in space. For example, the first and second heat pipes 13 and 14 both extend along the same side face 12c of the cooling fan 12. Since the two heat pipes 13 and 14 go around the cooling fan 12 from the same direction, they can be led around more easily in the case 6 with the limited space. In other words, this leads to miniaturization of the portable computer 1.

In order to tilt the keyboard 7 so that its back is raised (i.e., it becomes higher with distance from the user) when in use, for example, some users operate the portable computer 1 with its back raised. If the portable computer 1 according to the present embodiment is tilted so that its back is raised, the first and second radiator members 15 and 16 are situated higher than the first and second heat generating components 21 and 22 with respect to the vertical. Thus, the first and second heat pipes 13 and 14 are in a bottom-heat mode such that their respective heat receiving portions 13a and 14a are situated lower than their heat radiating portions 13b and 14b. Based on the principle of its operation that utilizes capillarity, a heat pipe displays higher heat transfer efficiency in a bottom-heat mode than in the top-heat mode.

Since the two heat pipes 13 and 14 can be led around the cooling fan 12 from the same direction, according to the portable computer 1 of the present embodiment, a layout design can be made such that both the heat pipes 13 and 14 are easily brought to the bottom-heat mode.

If the first and second radiator members 15 and 16 are arranged back and forth along the flows of air from the cooling fan, the two radiator members 15 and 16 can be effectively cooled by means of, e.g., the one cooling fan 12.

The overall mounting height of modules that are arranged in the case 6 can be reduced by arranging the cooling fan 12 side by side with the circuit board 11 along a direction parallel to the surfaces of the circuit board. Thus, the case 6 can be made thinner than in the case where the cooling fan 12 is placed on the circuit board 11.

A portable computer 41 as an electronic apparatus according to a second embodiment of the invention will now be described with reference to FIG. 7. Like numbers are used to designate those parts which have the same functions as their counterparts in the portable computer 1 according to the first embodiment, and a description thereof is omitted.

A case 6 of the portable computer 41 contains third and fourth heat pipes 42 and 43 and an additional radiator section 40, as well as a circuit board 11, a cooling fan 12, first and second heat pipes 13 and 14, and a radiator section 10. The radiator section 40 has third and fourth radiator members 44 and 45.

A third heat generating component 46, for example, is mounted on a first surface 11a of the circuit board 11. A fourth heat generating component 47, for example, is mounted on a second surface. 11b of the circuit board 11. Like first and second heat generating components 21 and 22, the third and fourth heat generating components 46 and 47, among other circuit components mounted on the circuit board 11, generate a larger quantity of heat, for example.

Figure 7:
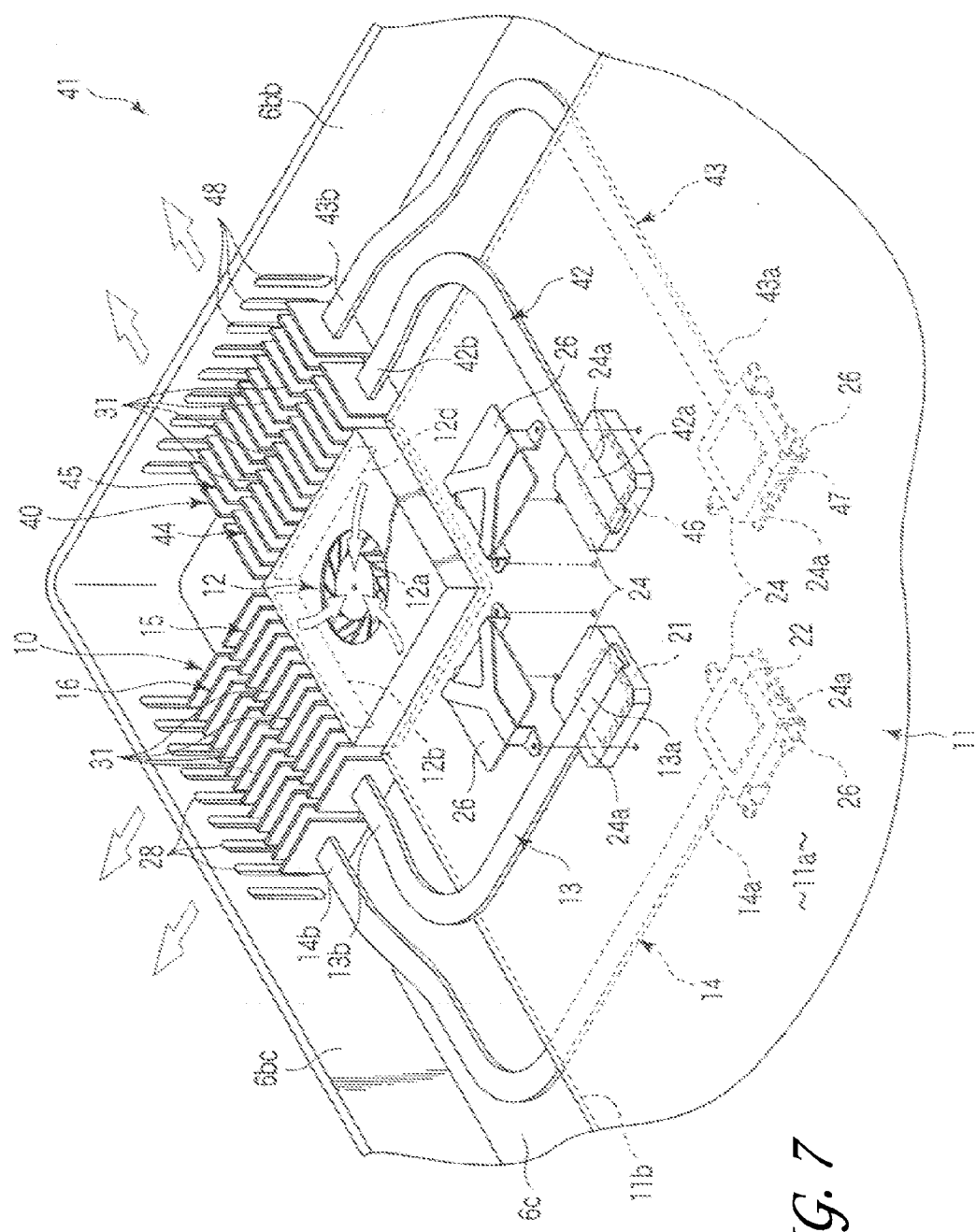
FIG. 7 is an exemplary perspective view showing the interior of a case of a portable computer according to a second embodiment of the invention.

As shown in FIG. 7, one end portion 42a of the third heat pipe 42 is attached to the third heat generating component 46. The third heat pipe 42 is an example of a third heat transfer member. One end portion 43a of the fourth heat pipe 43 is attached to the fourth heat generating component 47. The fourth heat pipe 43 is an example of a fourth heat transfer member. Each of the third and fourth heat pipes 42 and 43, like each of the first and second heat pipes 13 and 14, is thermally connected to the third and fourth heat generating component 46 or 47 through a heat receiving block 24.

The cooling fan 12 is located side by side with the circuit board 11 along a direction parallel to the surfaces 11a and 11b of the board 11. For example, a plurality of exhaust vents 48 is formed in a rear peripheral wall 6bb of the case 6 opposed to the cooling fan 12. The exhaust vents 48 open to the outside of the case 6. The cooling fan 12 has an additional exhaust port 12d through which air is discharged in a direction different from that of air discharged through an exhaust port 12b. The exhaust port 12d of the fan 12 faces the exhaust vents 48 of the rear peripheral wall 6bb. The cooling fan 12 discharges air toward the exhaust vents 48 through the exhaust port 12d.

The third and fourth radiator members 44 and 45 are located near the rear peripheral wall 6bb of the case 6 that is located off the circuit board 11. Both the radiator members 44 and 45 are disposed between the exhaust port 12d of the cooling fan 12 and the exhaust vents 48 of the rear peripheral wall 6bb. The fourth radiator member 45 is located side by side with the third radiator member 44. Both the third and fourth radiator members 44 and 45 are opposed to the cooling fan 12. The radiator members 44 and 45 extend parallel to each other and are arranged back and forth along flows of air.

The third heat pipe 42 extends along the first surface 11a of the circuit board 11 from the one end portion 42a attached to the third heat generating component 46 toward the rear peripheral wall 6bb of the case 6.

The third heat pipe 42 that extends beyond the circuit board 11 is bent toward the third radiator member 44. As shown in FIG. 7, the third heat pipe 42 bent in this manner is bent toward the bottom wall 6c of the case 6 so as to correspond to the center of the third radiator member 44 with respect to the vertical. The distal end portion of the third heat pipe 42 extends along the exhaust port 12d of the cooling fan 12 and penetrates a plurality of fin elements 31.

Specifically, the third heat pipe 42 is provided between the third heat generating component 46 and the third radiator member 44. The one end portion 42a of the third heat pipe 42 is thermally connected to the third heat generating component 46. The other end portion 42b of the third heat pipe 42 is thermally connected to the third radiator member 44. The third heat pipe 42 transfers heat generated by the third heat generating component 46 to the third radiator member 44.

The fourth heat pipe 43 extends along the second surface 11b of the circuit board 11 from the one end portion 43a attached to the fourth heat generating component 47 toward the rear peripheral wall 6bb of the case 6. The fourth heat pipe 43 that extends beyond the circuit board 11 is bent toward the fourth radiator member 45. The fourth heat pipe 43 bent in this manner is bent toward the top wall 6a of the case 6 so as to correspond to the center of the fourth radiator member 45 with-respect to the vertical. The distal end portion of the fourth heat pipe 43 extends along the exhaust port 12d of the cooling fan 12 and penetrates a plurality of fin elements 31.

The fourth heat pipe 43 is provided between the fourth heat generating component 47 and the fourth radiator member 45. The one end portion 43a of the fourth heat pipe 43 is thermally connected to the fourth heat generating component 47. The other end portion 43b of the fourth heat pipe 43 is thermally connected to the fourth radiator member 45. The fourth heat pipe 43 transfers heat generated by the fourth heat generating component 47 to the fourth radiator member 45.

According to the portable computer 41 constructed in this manner, as in the portable computer 1 according to the first embodiment, the plurality of heat generating components 21, 22, 46 and 47 can be cooled and mounted with high density. According to this portable computer 41, when compared with a case where heat pipes are arranged extending along only one side of a circuit board, for example, a lot of heat generating components can be cooled by means of the one cooling fan 12.

Since the heat generating components 21, 22, 46 and 47 are mounted separately on the obverse and reverse of the circuit board 11, the degree of freedom of the lead-around of the heat pipes 13, 14, 42 and 43 increases. For example, the four heat generating components 21, 22, 46 and 47 can be mounted with high density, and the radiator members 15, 16, 44 and 45 that are connected to the heat pipe 13, 14, 42 and 43 can be gathered in one place as they are cooled.

A portable computer 51 as an electronic apparatus according to a third embodiment of the invention will now be described with reference to FIGS. 8 and 9. Like numbers are used to designate those parts which have the same functions as their counterparts in the portable computers 1 and 41 according to the first and second embodiments, and a description thereof is omitted.

A case 6 of the portable computer 51 contains third and fourth heat pipes 42 and 43 and third and fourth radiator members 44 and 45, as well as a circuit board 11, a cooling fan 12, first and second heat pipes 13 and 14, and first and second radiator members 15 and 16.

Figure 8:
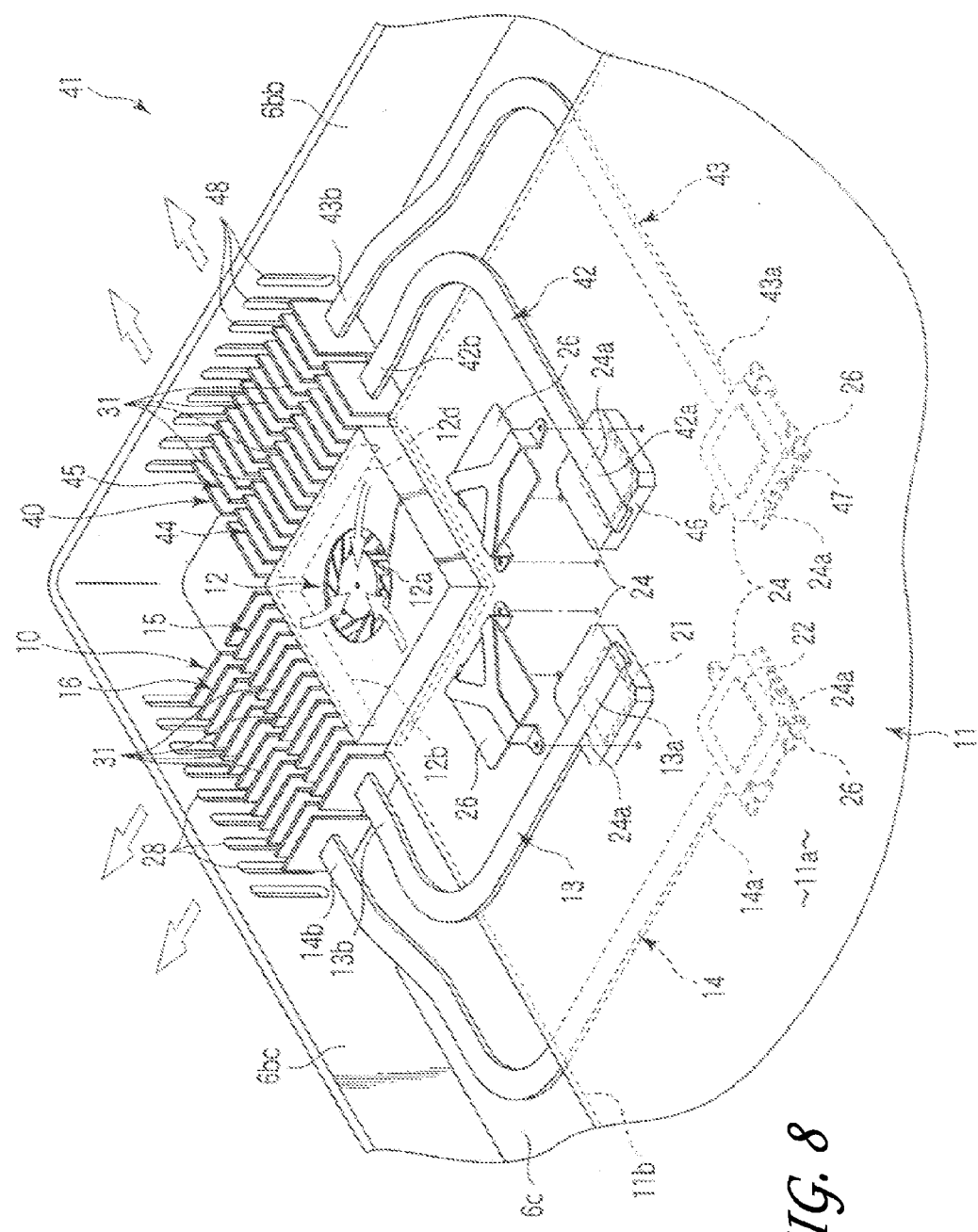
FIG. 8 is an exemplary perspective view showing the interior of a case of a portable computer according to a third embodiment of the invention.

As shown in FIGS. 8 and 9, each of the first and third radiator members 15 and 44 has a plurality of fin elements 31 and a top cover portion 52 that extends covering the respective upper ends of all the fin elements 31. The top cover portion 52 forms an example of an upper part of each of the first and third radiator members 15 and 44. The cover portion 52 may be formed either integrally with or independently of the fin elements 31. It is thermally connected to the fin elements 31.

On the other hand, each of the second and fourth radiator members 16 and 45 has a plurality of fin elements 31 and a bottom cover portion 53 that extends covering the respective lower ends of all the fin elements 31. The bottom cover portion 53 forms an example of a lower part of each of the second and fourth radiator members 16 and 45. The cover portion 53 may be formed either integrally with or independently of the fin elements 31. It is thermally connected to the fin elements 31.

As shown in FIG. 9, the first and third heat pipes 13 and 42 that are bent toward the first and third radiator members 15 and 44, respectively, are attached to the respective top cover portions 52 of the first and third radiator members 15 and 44, respectively. Thus, the first and third heat pipes 13 and 42 are attached to the upper surfaces of the first and third radiator members 15 and 44, respectively.

The second and fourth heat pipes 14 and 43 that are bent toward the second and fourth radiator members 16 and 45, respectively, are attached to the respective bottom cover portions 53 of the second and fourth radiator members 16 and 45, respectively. Thus, the second and fourth heat pipes 14 and 43 are attached to the lower surfaces of the second and fourth radiator members 16 and 45, respectively.

According to the portable computer 51 constructed in this manner, as in the portable computer 1 according to the first embodiment, the plurality of heat generating components 21, 22, 46,and 47 can be cooled and mounted with high density.

If the first and third heat pipes 13 and 42 that extend along the first surface 11a of the circuit board 11 are attached to the respective upper surfaces of the first and third radiator members 15 and 44, moreover, they need hardly be bent vertically relative to the case 6. Likewise, if the second and fourth heat pipes 14 and 43 that extend along the second surface 11b of the circuit board 11 are attached to the respective lower surfaces of the second and fourth radiator members 16 and 45, they need hardly be bent vertically relative to the case 6. These circumstances lead to improvement of the manufacturability of the portable computer 51 and reduction in cost thereof.

If the first and third heat pipes 13 and 42, for example, need not be substantially deformed vertically relative to the case 6, moreover, the end portions 13b and 42b attached to the first and third radiator members 15 and 44, respectively, can be restrained from being situated lower than the end portions 13a and 42a attached to the first and third heat generating components 21 and 46, respectively. Thus, the top-heat mode to which the first and third heat pipes 13 and 42 are brought can be eased. This leads to improvement of the cooling efficiency of the portable computer 51.

A portable computer 61 as an electronic apparatus according to a fourth embodiment of the invention will now be described with reference to FIGS. 10 and 11. Like numbers are used to designate those parts which have the same functions as their counterparts in the portable computers 1 and 51 according to the first and third embodiments, and a description thereof is omitted.

A case 6 of the portable computer 61 contains a circuit board 11, a cooling fan 12, first and second heat pipes 13 and 14, and a radiator section 63. The radiator section 63 has one radiator member 62. The radiator member 62 has a plurality of fin elements 31, a top cover portion 52, and a bottom cover portion 53.

The top and bottom cover portions 52 and 53 are attached to the upper and lower ends, respectively, of the fin elements 31 so as to cover them. The radiator member 62 is located between an exhaust port 12b of the cooling fan 12 and exhaust vents 28 of a left-hand peripheral wall 6bc. The radiator member 62 is opposed to the cooling fan 12.

Figure 10:
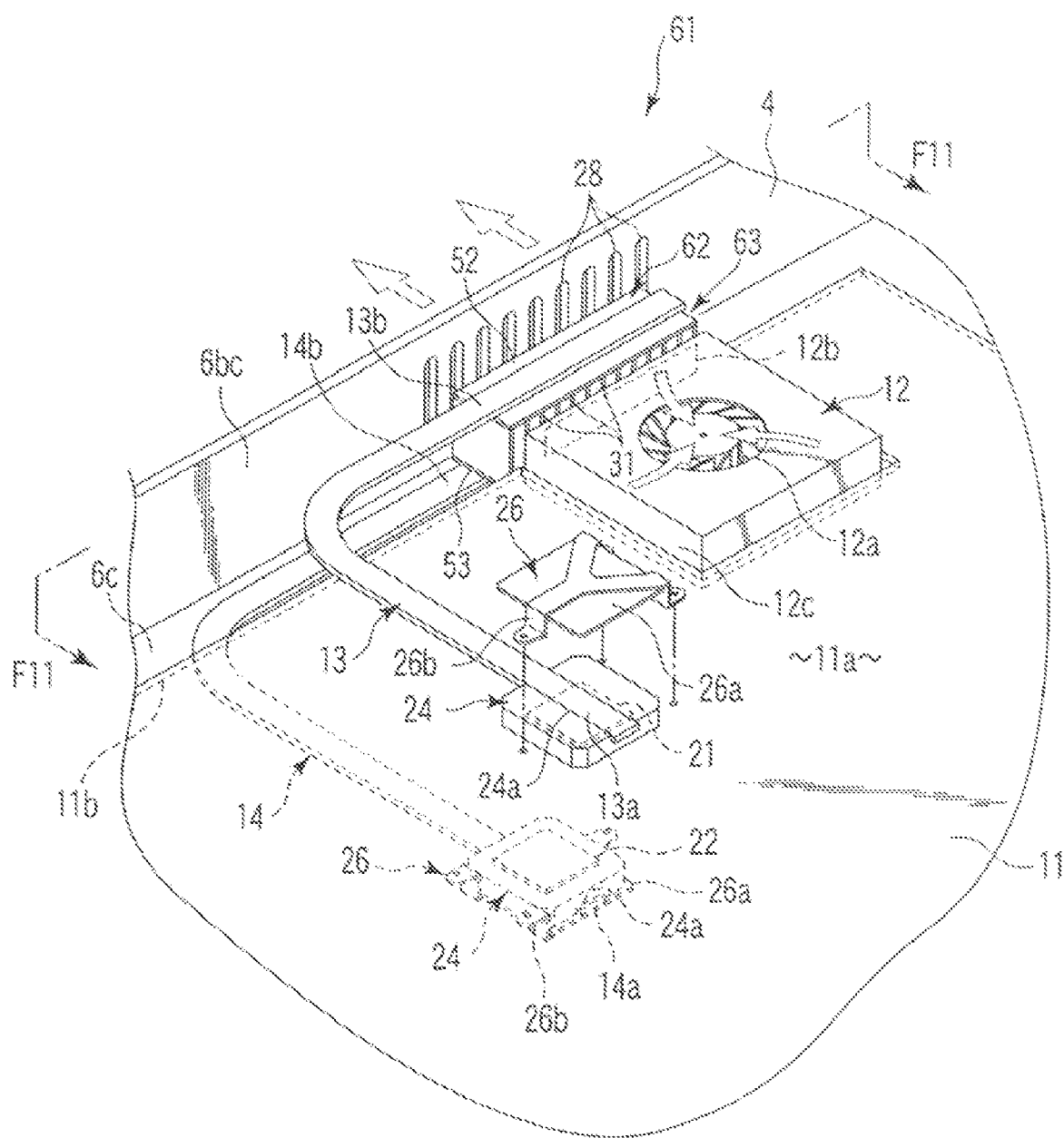
FIG. 10 is an exemplary perspective view showing the interior of a case of a portable computer according to a fourth embodiment of the invention.

As shown in FIGS. 10 and 11, the first heat pipe 13 that is bent toward the radiator member 62 is attached to the top cover portion 52 of the radiator member 62. Specifically, the first heat pipe 13 is attached to an upper part of the radiator member 62.

The second heat pipe 14 that is bent toward the radiator member 62 is attached to the bottom cover portion 53 of the radiator member 62. Specifically, the second heat pipe 14 is attached to a lower part of the radiator member 62.

According to the portable computer 61 constructed in this manner, a plurality of heat generating components 21 and 22 can be cooled and mounted with high density. Specifically, the first and second heat pipes 13 and 14 are attached, respectively, to the heat generating components 21 and 22 that are mounted separately on the obverse and reverse of the circuit board 11, and they are connected to the one radiator member 62. Thus, cooling of the plurality of heat generating components 21 and 22 can be accelerated by the one radiator member 62.

If the radiator member 62 is cooled by the cooling fan 12, for example, the cooling effect of the first and second heat generating components 21 and 22 is further enhanced. For the same reason as that for the portable computer 1 according to the first embodiment, the first and second heat pipes 13 and 14 can be brought to the bottom-heat mode when the portable computer 61 in operation is tilted with its back raised.

If the first and second heat pipes 13 and 14 are attached to the upper and lower surfaces, respectively, of the radiator member 62, the manufacturability of the portable computer 61 can be improved with reduced cost for the same reason as that for the portable computer 51 according to the third embodiment. The first heat pipe 13 can ease the top-heat mode.

Although the portable computers 1, 41, 51 and 61 according to the first to fourth embodiments have been described herein, the present invention is not limited to these embodiments. The components according to the first to fourth embodiments may be combined as required.

For example, the first and second heat pipes 13 and 14 according to the third embodiment may be attached to the one radiator member 62 according to the fourth embodiment, and the third and fourth heat pipes 42 and 43 to another radiator member 62. An example of each of the first to fourth heat transfer members may be any other member with a high heat transfer coefficient.

Electronic apparatuses to which the present invention is applicable are not limited to portable computers. The invention is applicable to various other electronic apparatuses, such as digital cameras, video cameras, personal digital assistants, etc.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a case;
   a circuit board contained in the case and including a first surface and a second surface formed on the reverse side of the first surface;
   a first heat generating component mounted on the first surface of the circuit board;
   a second heat generating component mounted on the second surface of the circuit board;
   a radiator section located off the circuit board;
   a first heat transfer member extending along the first surface of the circuit board and provided between the first heat generating component and the radiator section; and
   a second heat transfer member extending along the second surface of the circuit board and provided between the second heat generating component and the radiator section.

2. An electronic apparatus according to claim 1, which further comprises a cooling fan contained in the case, and wherein the radiator section includes a first radiator member located opposite the cooling fan and a second radiator member located side by side with the first radiator member and opposed to the cooling fan, the first heat transfer member is thermally connected to the first heat generating component and the first radiator member, and the second heat transfer member is thermally connected to the second heat generating component and the second radiator member.

3. An electronic apparatus according to claim 2, wherein the case includes a wall in which an exhaust vent opens, the cooling fan includes an exhaust port through which air is discharged toward the exhaust vent, and the first radiator member and the second radiator member are both located between the exhaust port of the cooling fan and the exhaust vent of the wall and arranged back and forth along a flow of the air.

4. An electronic apparatus according to claim 2, wherein the cooling fan is disposed in a position off the circuit board and located side by side with the circuit board along a direction parallel to the surfaces of the circuit board.

5. An electronic apparatus according to claim 2, wherein the first heat transfer member and the second heat transfer member extend along a side face on the same side of the cooling fan.

6. An electronic apparatus according to claim 2, wherein the first surface and the second surface are an upper surface and a lower surface, respectively, of the circuit board, an end portion of the first heat transfer member attached to the first radiator member is attached to an upper part of the first radiator member, and an end portion of the second heat transfer member attached to the second radiator member is attached to a lower part of the second radiator member.

7. An electronic apparatus according to claim 2, which further comprises a third heat generating component mounted on the first surface of the circuit board, a fourth heat generating component mounted on the second surface of the circuit board, a third radiator member located off the circuit board, a fourth radiator member located side by side with the third radiator member, a third heat transfer member extending along the first surface of the circuit board and located between the third heat generating component and the third radiator member, and a fourth heat transfer member extending along the second surface of the circuit board and located between the fourth heat generating component and the fourth radiator member.

8. An electronic apparatus according to claim 7, wherein an additional exhaust vent opens in a wall of the case, the cooling fan includes an additional exhaust port through which air is discharged toward the additional exhaust vent, and the third radiator member and the fourth radiator member are both located between the additional exhaust port of the cooling fan and the additional exhaust vent of the wall.

9. An electronic apparatus according to claim 1, wherein the radiator section includes a radiator member, the first heat transfer member is thermally connected to the first heat generating component and the radiator member, and the second heat transfer member is thermally connected to the second heat generating component and the radiator member.

\* \* \* \* \*